US007829965B2

(12) United States Patent
Hoague et al.

(10) Patent No.: US 7,829,965 B2
(45) Date of Patent: Nov. 9, 2010

(54) TOUCHING MICROLENS STRUCTURE FOR A PIXEL SENSOR AND METHOD OF FABRICATION

(75) Inventors: Timothy J. Hoague, Colchester, VT (US); Robert K. Leidy, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 1575 days.

(21) Appl. No.: 10/908,601

(22) Filed: May 18, 2005

(65) Prior Publication Data

US 2006/0261426 A1   Nov. 23, 2006

(51) Int. Cl.
*H01L 31/0232* (2006.01)
*G03F 7/20* (2006.01)
(52) U.S. Cl. ...................... 257/432; 430/231
(58) Field of Classification Search ............... None
See application file for complete search history.

(56) References Cited

U.S. PATENT DOCUMENTS

| 5,948,281 | A | 9/1999 | Okazaki et al. | |
|---|---|---|---|---|
| 5,997,756 | A | 12/1999 | Okazaki et al. | |
| 2002/0034014 | A1 | 3/2002 | Gretton et al. | |
| 2002/0117766 | A1* | 8/2002 | Kim | 264/1.38 |
| 2004/0099633 | A1 | 5/2004 | Okada et al. | |
| 2004/0146807 | A1 | 7/2004 | Lee et al. | |
| 2004/0147059 | A1 | 7/2004 | Jeong et al. | |
| 2004/0156112 | A1 | 8/2004 | Nakajima | |
| 2005/0002204 | A1* | 1/2005 | Lin et al. | 362/551 |
| 2005/0029433 | A1 | 2/2005 | Sakoh et al. | |
| 2005/0061950 | A1* | 3/2005 | Jiang et al. | 250/208.1 |
| 2005/0181311 | A1* | 8/2005 | Nakajima | 430/321 |
| 2006/0023314 | A1* | 2/2006 | Boettiger et al. | 359/621 |
| 2006/0119950 | A1* | 6/2006 | Boettiger et al. | 359/626 |
| 2006/0183027 | A1 | 8/2006 | Lin et al. | |
| 2006/0261426 | A1 | 11/2006 | Hoague et al. | |
| 2006/0261427 | A1* | 11/2006 | Dillon et al. | 257/432 |

FOREIGN PATENT DOCUMENTS

| CN | 1445816 A | 10/2003 |
|---|---|---|
| EP | 0573219 A1 | 12/1993 |
| JP | 2003234912 | 8/2003 |
| JP | 2004-213753 | * 7/2004 |
| JP | 2005-010486 | 1/2005 |

OTHER PUBLICATIONS

"The simulation analysis for photolithography process of microlens array", dated Dec. 31, 2003.
English language Abstract of Japanese Patent No. JP2004070087A, dated Mar. 4, 2004.
U.S. Appl. No. 11/378,020, Feb. 2009, Office Action.

* cited by examiner

*Primary Examiner*—John A McPherson
*Assistant Examiner*—Anna L Verderame
(74) *Attorney, Agent, or Firm*—Scully, Scott, Murphy & Presser, P.C.; Anthony J. Canale (57) ABSTRACT

A structure and method for increasing the sensitivity of pixel sensors by eliminating a gap space formed between adjacent microlens structures in a pixel sensor array. Advantageously, exposure and flowing conditions are such that adjacent microlens structures touch (are webbed) at a horizontal cross-section, yet have a round lens shape in all directions. Particularly, exposure and flowing conditions are such that each touching microlens structure is formed to have a matched uniform radius of curvature at a horizontal cross-section and at a 45 degree cross-sections.

12 Claims, 7 Drawing Sheets

FIG. 1B
(PRIOR ART)
POST FLOW

FIG. 1A
(PRIOR ART)
PRE FLOW

TOUCHING MICROLENS STRUCTURE FOR A PIXEL SENSOR AND METHOD OF FABRICATION

BACKGROUND OF THE INVENTION

1. Field of the Invention

The present invention related generally to the fabrication of semiconductor pixel sensor arrays, and more particularly, to a novel semiconductor pixel structure and novel process therefor for increasing the sensitivity of the pixel sensors by optimizing the formed microlens structure.

2. Discussion of the Prior Art

CMOS image sensors are beginning to replace conventional CCD sensors for applications requiring image pick-up such as digital cameras, cellular phones, PDA (personal digital assistant), personal computers, and the like. Advantageously, CMOS image sensors are fabricated by applying present CMOS fabricating process for semiconductor devices such as photodiodes or the like, at low costs. Furthermore, CMOS image sensors can be operated by a single power supply so that the power consumption for that can be restrained lower than that of CCD sensors, and further, CMOS logic circuits and like logic processing devices are easily integrated in the sensor chip and therefore the CMOS image sensors can be miniaturized.

Figure 1A:
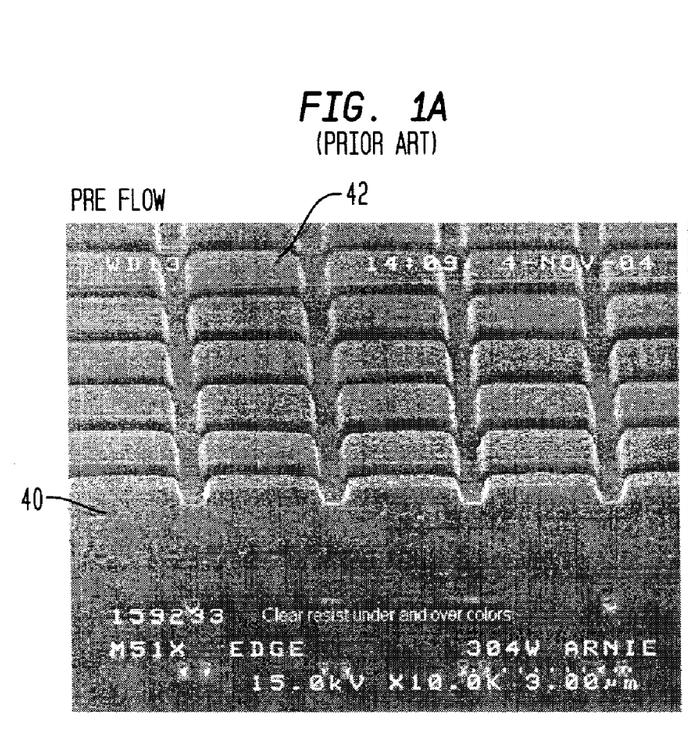
FIGS. 1(a) and 1(b) depicts pixel sensor arrays formed according to conventional semiconductor manufacturing techniques.
Figure 1B:
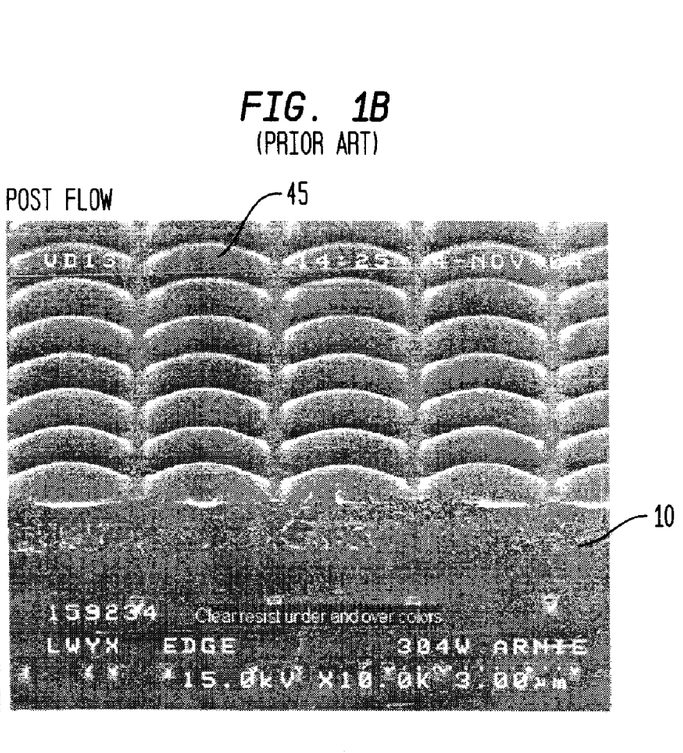

The patent literature is replete with references describing image sensor arrays having a microlens structure and aspects of their manufacture. United States Patent Publication Nos. 2002/0034014, 2004/0099633, 2004/0146807, 2004/0147059 and 2004/0156112 describe state of the art microlens structures and methods of manufacture for image arrays. Basically, the typical method for fabricating a microlens structure comprises: first a layer of photoresist is applied, e.g., by spin coating or like application process (e.g., dip coating, chemical vapor deposition, brushing, evaporation and other like deposition techniques), atop a wafer surface. For instance, as shown in FIG. 1(a), the wafer surface may comprise a dielectric planarization layer formed over a substrate 40 that includes an array of color filter structures each associated with an active light sensitive device (e.g., photodiode) of a pixel. It is understood that a positive or negative photoresist may be applied with attendant photolithographic processing steps applied; however, for purposes of discussion, it is assumed a negative photoresist is applied. After a soft bake process, a photoresist mask, such as chrome on glass, is applied having a patterned grid comprising a two-dimensional array of translucent squares or rectangle openings corresponding to the pixel microlens structure to be printed. After aligning the mask to the correct location, the mask and wafer are exposed to a controlled dose of UV light to transfer the mask image. In this example, polymer resist in each of the exposed square (or rectangular) regions are crosslinked so that these regions do not dissolve in a subsequent application of a developer chemical. Then, after a post-exposure bake process, a developer step is performed (the kinds of developers that can be employed are well known to those skilled in the art and are dependent on whether a positive or negative photoresist is employed) to remove the soluble areas of the photoresist leaving a visible array pattern of square (or rectangular) shaped islands 42 on the wafer surface separated by thin gaps. Then, as shown in FIG. 1(b), after a further blanket expose step, the photoresist pattern is subject to a heating and reflow process to convert the raised photoresist islands into semi-spherical convex lenses 45 of circular plan shape linearly aligned in correspondence with the color filter and active photoelectric converting device.

Figure 2:
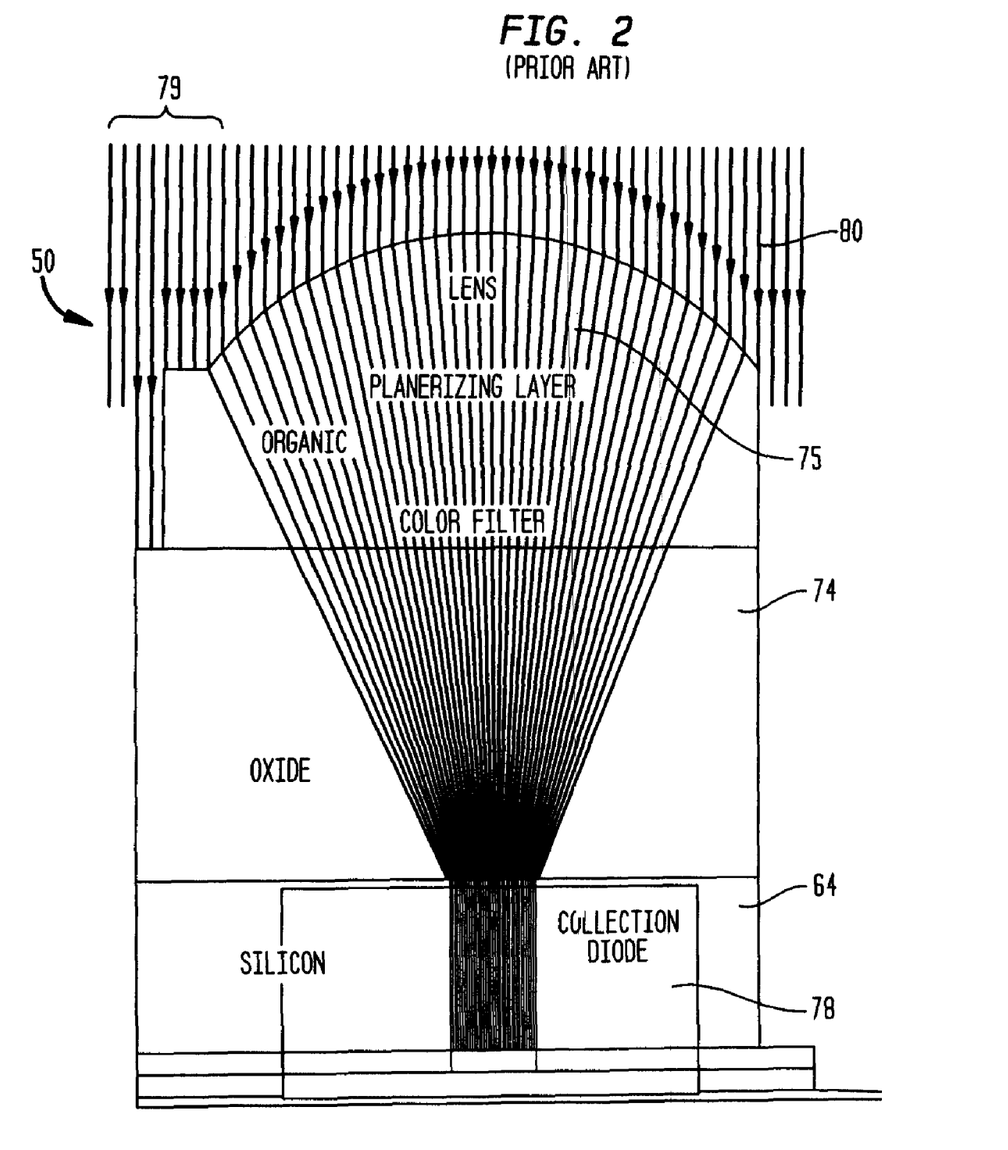
FIG. 2 illustrates, through a cross-sectional view, a prior art pixel sensor cell 50 showing a gap adjacent a microlens of the array that compromises pixel cell sensitivity.

It is the case however, that the microlens structures formed in this manner exhibit light loss between the lenses. For example, FIG. 2 illustrates a cross-sectional view of a single image sensor (pixel cell) 50 including a formed microlens 75 on top of the active pixel element, e.g., a light sensitive photodiode 78 formed in the Silicon or Silicon containing substrate 64. As known, the microlens 75 are used in the pixel image sensors to focus incident light 80 into the active area in the pixel. Without the microlens, much of the light is not collected that would strike the cell and, even worse, some light would get reflected off of the interlevel metallization, e.g., Cu metal wires (not shown), formed in interlevel dielectric material layer 74 and strike adjacent cells which blur the image. As the technology scales to smaller pixels it becomes increasingly critical to collect as much light as possible by minimizing the space between the pixels. For instance, FIG. 2 depicts a raytrace model depicting normal incidence light 80 on a 2.75 um radius lens 75 on a 4.5 μm pixel cell. In this state of the art imaging sensor device 50, each adjacent microlens of the pixel array is separated by a gap 79 which acts to decrease the amount of light focused to the active photodiode element 78 of the pixel, thus, compromising the sensitivity of the imager pixel array.

Figure 3:
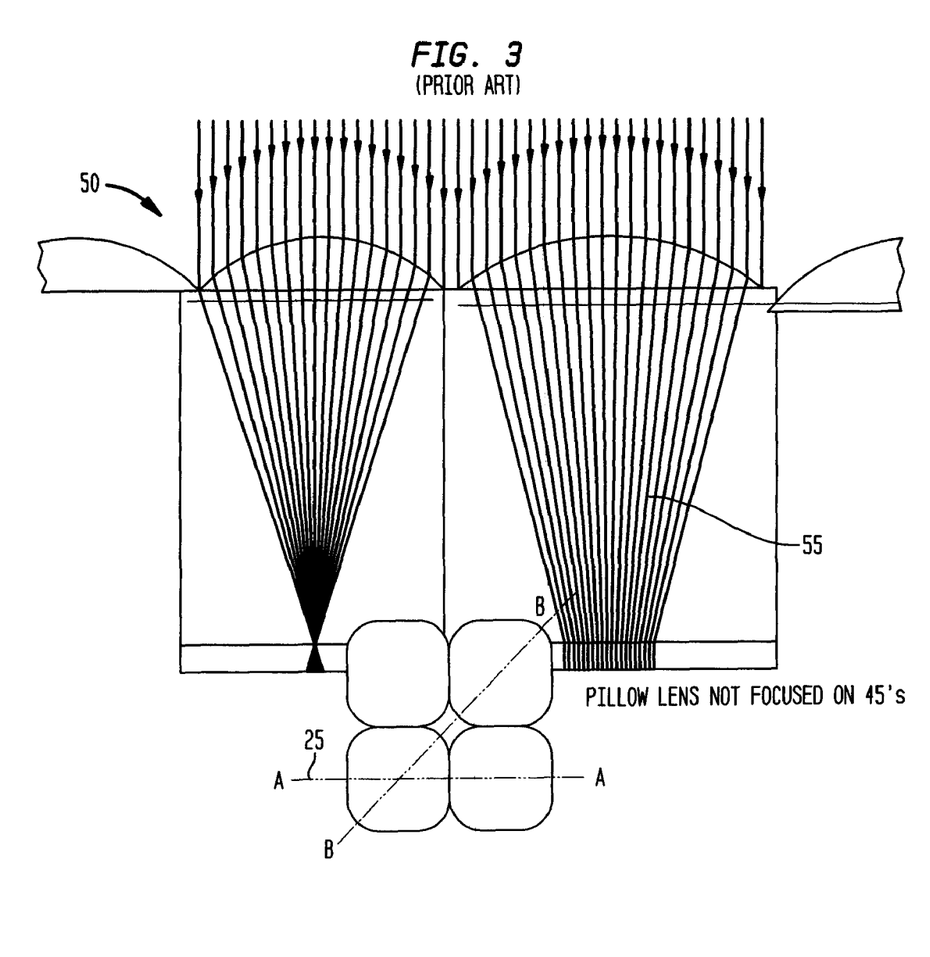
FIG. 3 illustrates, through a cross-sectional view, a prior art pixel sensor cell 50 showing the mismatched radius of curvature at the webbed (horizontal) cross section as compared to the cross-section at the 45 degree cut that resulting in an unfocused pillow lens structure.

Even if adjacent cells can be formed to touch, adjacent pixel cells may exhibit an ideal radius of curvature in horizontal cross-section, for example, as shown in FIG. 3 where the cross section 25 is taken along line A-A of a formed lens 50 exhibiting a radius of curvature at the horizontal edges. However, the cross section 30 taken along line B-B and angled at 45 degrees is not matched to the cross-section because the resultant lens 50 is square (driven by the pixel microlens structure being a square). The radius of curvature of the microlens structure particularly determines the focal length of the microlens, so as long as the vertical dimensions do not shrink—which is often the case—the microlens radius of curvature must remain the same as the cell shrinks. To achieve the same radius of curvature while the cell shrinks, the microlens thickness must be reduced to a point where it is very difficult to make. For example, a 2.2 μm cell would require a lens thickness of 360 nm and to achieve this dimension, a spin coating over topography would have to be below 300 nm.

It is further the case that the smaller the pixel size, the greater the percentage of light is wasted between the lenses.

It would be highly desirable to provide a pixel sensor and method of manufacture wherein the sensor includes a microlens structure having substantially no space between the microlens structure of adjacent pixels to thus maximize light collection, and further that are fabricated in a manner such that adjacent microlens are fully formed having uniform radius of curvature at the cross-section and angled cuts so as to maximize light being focused into the active pixel element.

SUMMARY OF THE INVENTION

This invention addresses a structure and method for increasing the sensitivity of pixel sensors (e.g., optical image sensors) by eliminating the gap space formed between adjacent microlens structures in a pixel imaging array. This is achieved by forming a webbed lens that provides advantages as having substantially no gap; however, further the formed microlens structure has a radius of curvature at the 45° degree that is matched to the radius of curvature of the lens cross-section to increase sensitivity for receiving more light. Preferably, the corners are open because they get more light (at the crosses) where two pixels meet; however, the corners are formed down from the webbed edges—so the 45° degree radius of curvature can be matched to the cross-section maximizing the light collection.

Thus, according to a first aspect of the invention, there is provided a touching microlens structure whereby the gaps between adjacent microlens structures is tailored to achieve a level of horizontal webbing and corner openness such that all light incident to the microlens is optimally captured and focused into the pixel active device area. Thus, the microlens array for the pixel sensor comprises microlens structures that remain connected and perfectly formed, i.e., the 45° degree radius of curvature of the formed lens structure is matched to the cross-section of the formed lens structure thereby maximizing the light collection, even at the reduced pixel sizes.

According to a second aspect of the invention, there is provided a method for fabricating a touching microlens structure for a pixel array or sensor whereby the gaps between adjacent microlens structures is tailored to achieve a level of horizontal webbing and corner openness such that all light incident to the microlens is optimally captured and focused into the pixel active device area. In accordance with this aspect of the invention, a solution is provided whereby the lithographic image in sub-resolution remains connected with a partial opening and when this image is flowed to form a lens, the lenses remain connected and perfectly formed. In addition, it is found that by further underexposing out this image, thin lenses can be made with thick material. Thus, instead of controlling the microlens thickness with resist thickness—which becomes difficult as the lens get thinner as they scale, the thickness is adjusted by the lithographic conditions (sub-threshold exposure, develop, blanket exposure and post expose bake, or develop). In this manner, a microlens structure is achievable that remains connected and perfectly formed, and beneficially, the 45° degree radius of curvature of the formed lens structure can be matched to the cross-section of the formed lens structure, thereby maximizing the light collection.

Advantageously, according to the methodology of the invention, dimensions of the microlens structure, including lens size, height and radius of curvature can be controlled for webbed microlens designs. Moreover, very thin webbed lens structure can be made with thick resist producing a more focused lens.

BRIEF DESCRIPTION OF DRAWINGS

The objects, features and advantages of the present invention will become apparent to one skilled in the art, in view of the following detailed description taken in combination with the attached drawings, in which.

DETAILED DESCRIPTION OF THE PREFERRED EMBODIMENTS

A method for forming a webbed microlens structure according to the invention includes first flowing a patterned photoresist on providing a smooth planarization layer or equivalent substrate. However, to achieve touching of the microlenses, according to the invention, the photoresist pattern is "webbed" before flow. Webbing is achieved by a variety of methods: for instance, by controlling (e.g., reducing) the initial UV exposure dose; focusing can be set at a non-optimal value; develop time, temperature, or concentration can be reduced; or, the post exposure bake can be used to affect the rate of cross-linking polymers of the resist material. The mask image may additionally be compensated or the wavelength or numerical aperture (NA)/Sigma combination of the lithography tool altered to web the image. After application of one or more of these process modifications, the bottom of the photoresist in the transferred images connects to the bottom of the adjacent gap, i.e. a web is formed. Then, after a subsequent reflow process, the desired lens shape is formed.

Figure 5:
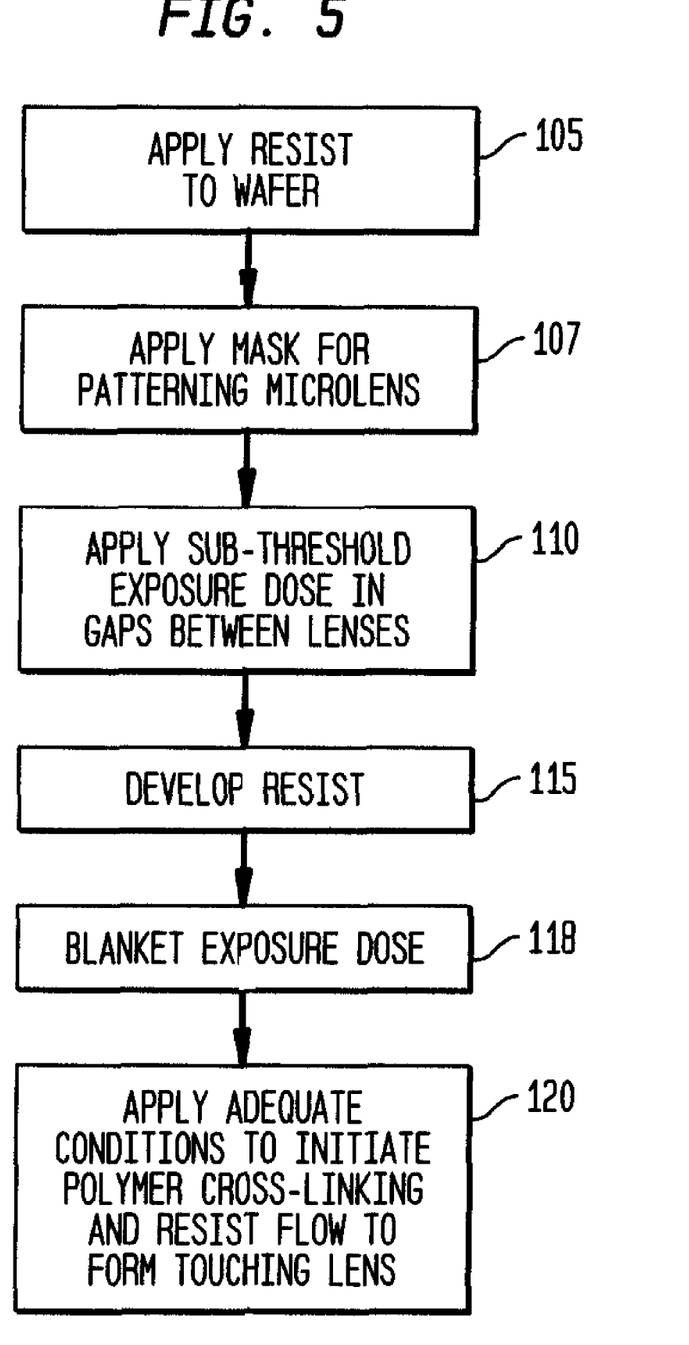
FIG. 5 illustrates a method of forming the touching microlens structure according to the invention.

Thus, as shown in FIG. 5, the inventive method 100 comprises steps of first applying the resist to the wafer surface as indicated at step 105. The resist material may comprise positive or negative photoresist materials well known in the art; however, preferably, a positive resist is applied (such as an industry standard transparent photoresist, e.g., JSR, MF401H) on to one surface of semiconductor wafer utilizing conventional spinning techniques and conditions. The thickness of the spun down resist may vary depending on the rotational speed of the wafer employed in the spinning process and the type of resist material being spun. Typically, the spinning conditions are such that the resist is spun down to a resist film thickness ranging from about 0.3 microns to about 2.0 microns.

It is understood that prior to applying the resist to the semiconductor wafer, the wafer may be cleaned and/or treated to increase the adhesion of semiconductor wafer for resist. This treatment consists of processes well known to those skilled in the art and includes, but is not limited to: mechanical roughening with pumice and vapor blast, chemical roughening with etchants and oxide treatments, and chemical adhesion promoters such as silane coupling agents.

Then, as shown at step 107, a photoresist mask, such as chrome on glass, is applied having a patterned translucent grid comprising a two-dimensional array of opaque squares or rectangles corresponding to the pixel microlens structure to be printed. After aligning the mask to the correct location, the mask and wafer are exposed to a controlled dose of UV light to transfer the mask image.

According to the invention, the structure is exposed to a sub-threshold blanket exposure step 110 under conditions which are effective to thin the resist material in the areas forming gaps in the microlens array structure but are insufficient to totally remove the resist material, i.e., the locations of gaps between pixels are partially developed. By "sub-threshold", it is meant partially exposing a resist material to UV light energy such that the dose of the UV light energy is effective to thin some areas of the resist but is insufficient to clear the resist under normal development conditions.

Specifically, the resist material is exposed to a partial blanket (sub-threshold) exposure step using a UV exposure tool that operates at energies of from about 0.01 to about 2 Joules/cm$^2$ or any range of exposure dosage commensurate with the resist thickness. The dose of UV light energy employed in this step of the present invention is a parameter which must be met in order to thin the resist as mentioned above. In accordance with the method of the present invention, the dose of UV light energy which is employed in the sub-threshold exposure step is applied for about 10 msec to about 130 msec. It is understood that preferred conditions for the sub-threshold exposure step are dependent upon the thickness of the photoresist layer. Example conditions for the lens thicknesses are as follows: UV light energy of from about 0.06 to about 0.2 Joules/cm$^2$ at a dosage of from about 45 msec to about 120 msec. It is emphasized that this step of the present invention is carried out under controlled conditions which are not capable of totally removing the resist material in the gaps. Instead, the conditions are such that the only some of the exposed resist regions are removed in the development step to result in a webbing of the lenses together.

It is understood that any wavelength of light within the UV range, e.g. 365 nm (Mid-UV) or 248 nm (Deep-UV), may be employed in the present invention and may be filtered to achieve the proper dose. When a 365 nm UV light energy source is employed, this step of the present invention is carried out at an energy of from about 0.04 to about 2.0 Joules/cm$^2$, more preferably from about 0.06 to about 1.0 Joules/cm$^2$. When the UV light energy is from a 248 nm light source, the sub-threshold exposure step is carried out at an energy of from about 0.6 to about 1.2 Joules/cm$^2$, more preferably about 0.8 to about 1.0 Joules/cm$^2$. It is understood that the dosages applied will vary dependent upon lens thickness.

It is further understood that the thinned optically sensitive resist of the present invention obtained by utilizing a sub-threshold exposure step wherein a dose of UV energy effective to thin predetermined areas of the resist but insufficient to clear the resist under normal development conditions is employed, after development, retains its sensitivity to exposure. Therefore, the resist of the present invention can be re-exposed with a pattern mask to achieve imaging at ultra-thin resist conditions.

Then, as shown in FIG. 5, the sub-threshold exposed structure is developed at step 115 utilizing an organic solvent (hereinafter "developer") that dissolves the partially exposed areas. Generally, the partially exposed areas of resist are developed by conventional methods which include, but are not limited to: using propylene carbonate, gamma butyrolactone, an ammonium hydroxide such as tetramethyl ammonium hydroxide, diglyme or mixtures thereof. A highly preferred developer employed in the present invention is A2300 MIF (0.263 N) supplied by International Business Machines Corporation which comprises about 2% tetramethyl ammonium hydroxide and 98% water.

As further shown in FIG. 5, at a next step 118, a further blanket (i.e., bleaching) expose dose is applied to the whole structure (including gaps and lenses) at approximately the same dose as the imaging dose as applied at step 110. It is understood that the flow conditions and bleaching dose must be carefully controlled to effect the rate of cross-linking of the polymeric compounds to achieve a desired thickness of the microlens material in the gap and desired lens shape (i.e., radius of curvature and lens thickness). Preferably, this additional exposure is applied to the formed webbed areas to promote faster polymer cross-linking in these areas.

After the additional post-development exposure or "bleaching" dose to initiate cross-linking the polymer chains in the resist in a desired manner, as indicated at step 120, the flow conditions are applied to melt the photoresist and form the microlens structure. This requires an application of thermal energy (temperature) to convert the raised photoresist islands into semi-spherical convex lenses of circular plan shape. It is understood that a carefully controlled dose is essential due competing conditions relating between flow (needed to melt into lens shape) and the cross-linking reaction that stops the flow. For example, greater dosage increases free radicals that cross-link so double exposed webbed region cross-links first, thus preventing the lenses from webbing together. That is, flow bake conditions are such that the corner areas of the lenses, e.g., at the 45° (degree) cut, are down from the webbed edges so that the radius of curvature can be matched to the cross-section of the lenses at the webbed edges thereby maximizing the light collection. Flow temperatures ranging between 180° C.-220° C., e.g., 210° C., may be applied for a time adequate to ensure adequate rate of cross-linking versus melting rate and ensure complete cross-linking.

Figure 6:
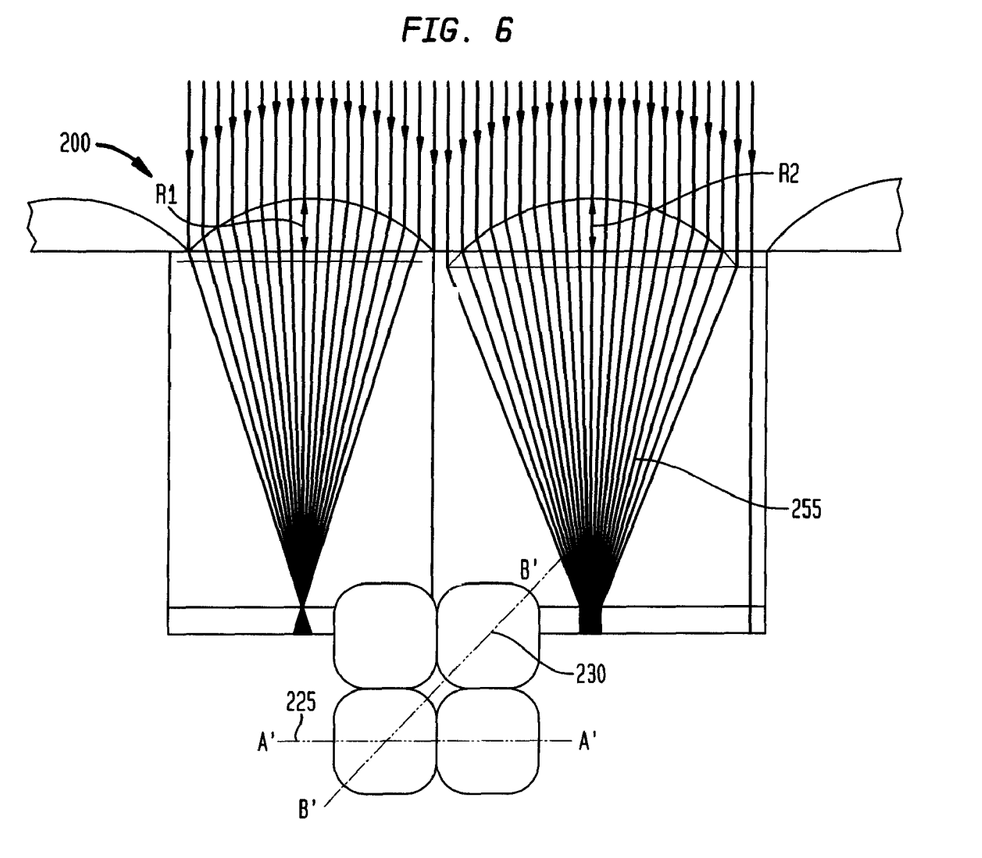
FIG. 6 illustrates through a cross-sectional view, a pixel sensor cell 200 formed in accordance with the present invention showing a matched radius of curvature at the webbed (horizontal) cross section as compared to the cross-section at the 45 degree cut; and, FIG. 7 shows a graphical depiction of a cross section analysis of an example microlens structure formed according to the method of the invention with a lens width "w" and a height "h" and points depicting the shrinking of the lens at the gaps, with the radius of curvature "R" at the cross-section view depicted.

FIG. 6 shows an example of a webbed microlens structure 200 formed in accordance with the process of the invention. As shown in FIG. 6, the cross section 225 taken along line A'-A' of a formed lens 200 includes webbed edges at an ideal radius of curvature R1 according to a desired focal length of the microlens structure; and, according to the invention, the radius of curvature R2 at cross section 230 taken along line B'-B' and angled at 45 degrees is additionally matched to the cross-section 225. This is due to the fact that due to the carefully controlled additional expose and bake conditions that control the horizontal webbing and effectively enable the corner areas of the lenses, e.g., at the 45° (degree) cut, to be shrunk in the vertical dimension at a distance lower than the webbed edges, e.g., by a distance "d", such that the radius of curvature can be matched to the cross-section. In the example microlens design shown in FIG. 6, there is approximately a 0.2 μm webbing horizontally with open corners at the 45° cut in the ideal lens structure of this embodiment, resulting in more focused light 255 in the microlens cell structure 200 as compared to the light 55 focused at the received 45° cut in the lens structure shown in the prior art microlens structure of FIG. 3.

Figure 7:
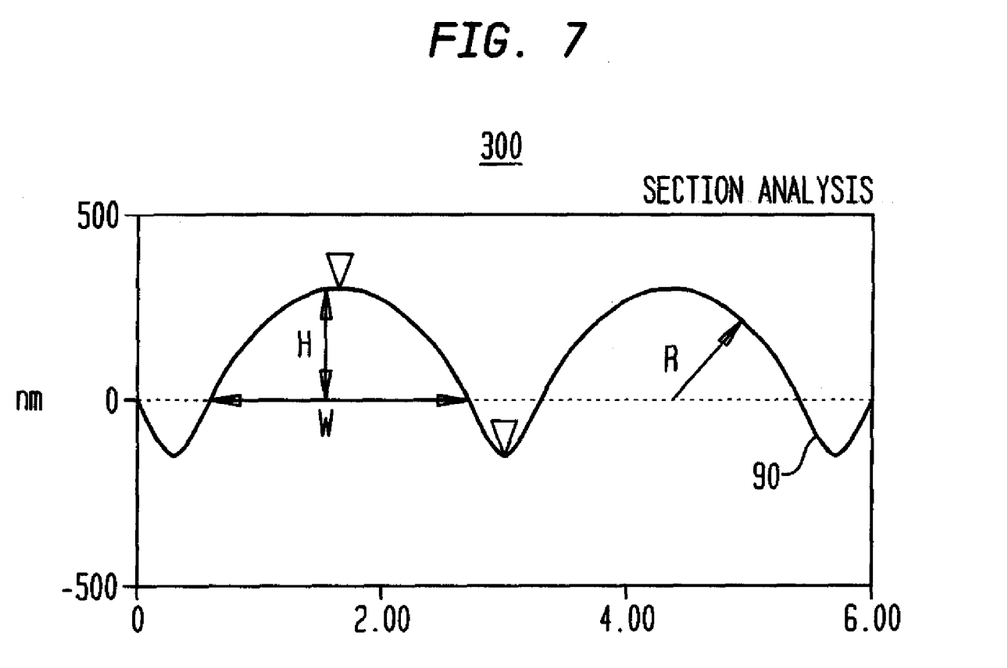

Advantageously, according to the methodology of the invention, dimensions of each microlens structure of a pixel or sensor array, including lens size, height and radius of curvature can be controlled for webbed microlens designs having a round shape of the lens in all directions. FIG. 7 shows a graphical depiction 300 of a cross section analysis 90 of an example measurement of a microlens formed according to the method of the invention with a lens width "W" and a height "H" and points depicting the shrinking of the lens at the gaps, with the radius of curvature "R" at this cross-section view governed according to equation (1) as follows:

$$R^2 = H^2 + (W/2)^2/2H \qquad (1)$$

Figure 4:
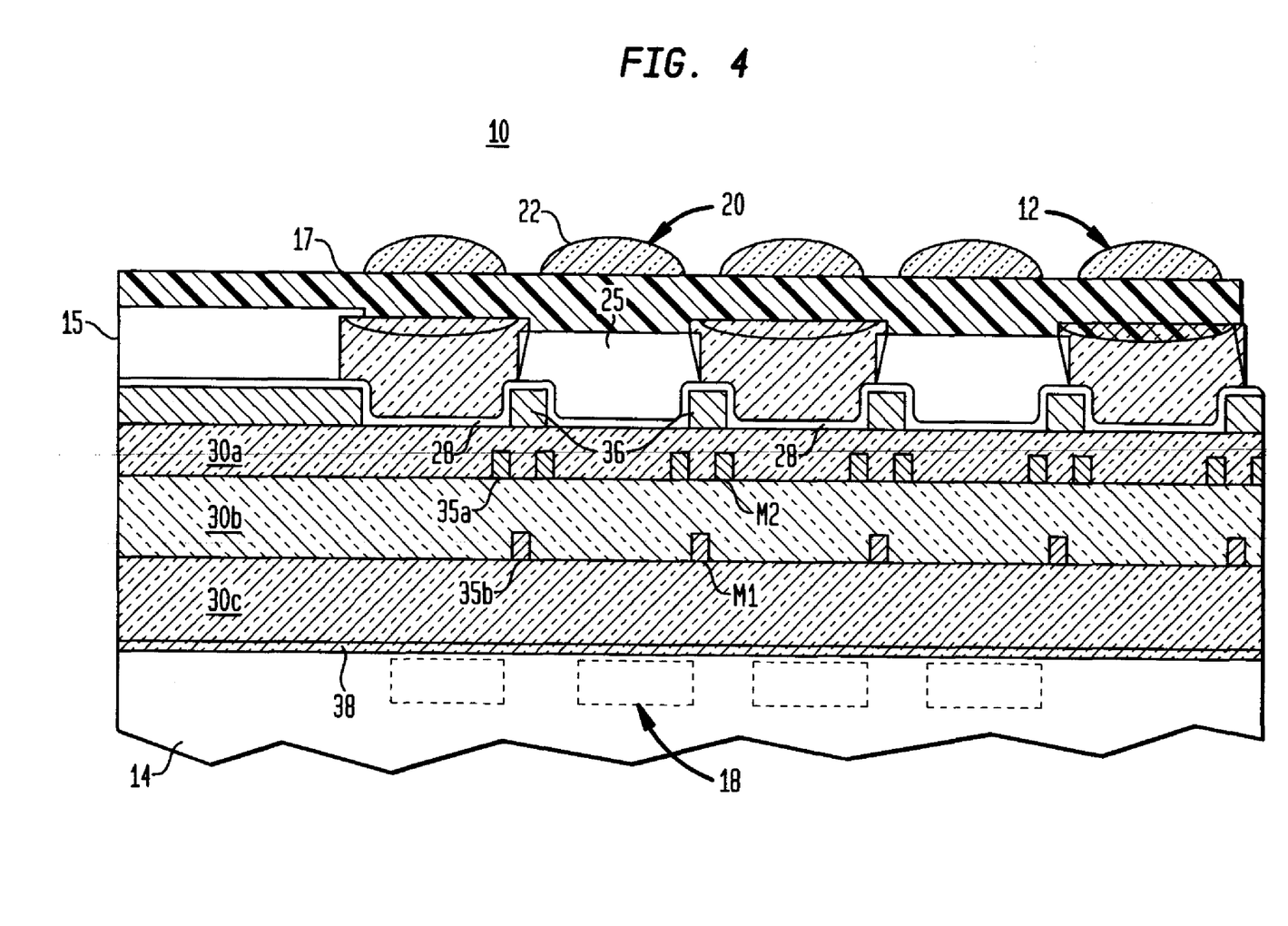
FIG. 4 depicts a pixel sensor array 10 in which the touching microlens structure of the present invention may be employed.

FIG. 4 depicts a pixel sensor array 10 in which the webbed microlens structure 200 formed in accordance with the invention may be employed. As shown, the array comprises a plurality of microlenses 12, each having a hemisphere or semi-hemishperical shape, arranged on a smooth planarization layer 17, e.g., a spin on polymer, that is formed on top of a filter array, e.g., color filters 15, enabling formation of the microlens array. The color filter array 15 includes individual red, green and blue filter elements 25 (primary color filters) or alternately, cyan, magenta and yellow filter elements (complementary color filter). Each microlens 22 of the microlens array 12 is aligned with a corresponding color filter element 25 and comprises an upper light receiving portion of a pixel 20. The pixel 20 includes a cell portion fabricated upon a semiconductor substrate 14 portion including a stack of comprising one or more interlevel dielectric layers 30a-30c incorporating metallization interconnect levels M1, M2 Aluminum Al or Cu wire layers 35a, 35b. Interlevel dielectric materials may comprise a polymer or $SiO_2$, for example. As Al metallization interconnect layers 35a, 35b do not require passivation, no respective barrier layers are shown. As further shown in FIG. 4, each pixel cell 20 having the Al metallizations 35a,b further includes a final Aluminum metal level 36 that enables wire bonding to the M1 and M2 metallizations between each pixel 20, and a final passivation layer 28 is formed above the wire bonding level 36. This final passivation layer 28 may comprise SiN, $SiO_2$, or combinations of these.

Although not shown in detail, each pixel 20 includes an active photoelectric converting device including a light sensitive element such as a photodiode 18 that performs photoelectric conversion and a CMOS transistor (not shown) that performs charge amplification and switching. Each of the pixels 20 generates a signal charge corresponding to the intensity of light received by each pixel and is converted to a signal current by the photoelectric conversion (photodiode) element 18 formed on semiconductor substrate 14.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

What is claimed is:

1. A method for fabricating a microlens structure in a pixel sensor array comprising the steps of:
    a. providing a substrate including a plurality of light sensitive elements adapted to receive light incident to a respective pixel microlens;
    b. forming a photoresist material layer over said substrate;
    c. patterning said photoresist layer using a first sub-resolution condition to form microlens structure images, said first sub-resolution condition applied in a manner sufficient to form partially connected lens portions at gaps between adjacent microlens structures;
    d. developing said photoresist layer to partially form the patterned microlens structures having partially connected lens portions at said gaps;
    e. blanket applying a second sub-resolution condition to the partially formed microlens structures; and,
    f. flowing said partially formed microlens structures, wherein each microlens structure is webbed such that said microlens structure touches a microlens structure of an adjacent pixel in said array, and such that a curvature of said microlens structure is uniform in all directions to thereby maximize collection of light incident to the microlens structure from all directions.

2. The method as claimed in claim 1, wherein said first and second sub-resolution conditions comprise a light exposure dose applied to said patterned photoresist layer to initiate cross-linking of polymers of said photoresist material.

3. The method as claimed in claim 2, wherein said patterning step, comprises applying said first sub-resolution condition to a mask image that ensures polymer cross-linking at gaps located between adjacent cells at a horizontal cross section.

4. The method as claimed in claim 2, wherein said first and second sub-resolution conditions comprise an exposure dose of UV light at energies ranging from about 0.01 to about 2 Joules/$cm^2$.

5. The method as claimed in claim 1, wherein said flowing step f. comprises a post-exposure bake process for applying heat to said microlens structures at a temperature ranging from about 180° C. to about 220° C.

6. The method as claimed in claim 1, wherein each said touching microlens structure is of circular plan shape formed to have a matched uniform radius of curvature at a horizontal cross-section and at a 45 degree cross-section.

7. The method as claimed in claim 6, wherein said touching microlens structure at said 45 degree cross-section is formed at a lower vertical distance below a horizontal where the webbed edges touch at said horizontal cross-section so that the radius of curvature of the microlens can be matched to the radius of curvature of the microlens at the horizontal cross-section.

8. A method of controlling dimensions of a formed microlens structure of a sensor array, said dimensions including a lens size, height and radius of curvature, said method comprising:
    applying first exposure conditions to a photoresist layer patterned to partially form touching microlens structures and developing said layer after first dose exposure;
    blanket applying second exposure conditions to said partially formed touching microlens structures of said array; and,
    flowing said partially formed touching microlens structures of said array at temperatures sufficient to form adjacent microlens structures having a round lens shape in all directions.

9. The method as claimed in claim 8, wherein each said touching microlens structure is formed to have a matched uniform radius of curvature at a horizontal cross-section and at a 45 degree cross-section.

10. The method as claimed in claim 8, wherein said flowing step is conducted at a temperature sufficient to ensure shrinkage of each said touching microlens structure at said 45 degree cross-section such that the radius of curvature of the microlens at the 45 degree cross-section can be matched to the radius of curvature of the microlens at the horizontal cross-section.

11. The method as claimed in claim 10, wherein said blanket applying second exposure conditions and said flowing steps are conducted to ensure shrinkage of each said touching microlens structure at said 45 degree cross-section at a lower vertical distance below a horizontal where the lens edges touch at said horizontal cross-section.

12. The method as claimed in claim 8, wherein each said touching microlens structure is formed to have a lens width "w" and a height "h" and a radius of curvature "R" at any cross-section governed according to $R^2=h^2+(w/2)^2/2h$.

* * * * *